United States Patent [19]
Komurasaki et al.

[11] Patent Number: 5,973,539
[45] Date of Patent: Oct. 26, 1999

[54] MIXER CIRCUIT FOR MIXING TWO SIGNALS HAVING MUTUALLY DIFFERENT FREQUENCIES

[75] Inventors: Hiroshi Komurasaki; Hisayasu Satoh, both of Hyogo, Japan

[73] Assignee: Mitsubishi Denki Kabushiki Kaisha, Tokyo, Japan

[21] Appl. No.: 08/982,032

[22] Filed: Dec. 1, 1997

[30] Foreign Application Priority Data

May 21, 1997 [JP] Japan ...................................... 9-131266

[51] Int. Cl.$^6$ ....................................................... G06F 7/44
[52] U.S. Cl. ........................... 327/359; 327/120; 455/333
[58] Field of Search .......................... 327/116, 119–122, 327/356–359; 455/326, 333

[56] References Cited

U.S. PATENT DOCUMENTS

| | | | |
|---|---|---|---|
| 5,329,189 | 7/1994 | Ushida et al. ........................... | 307/529 |
| 5,378,997 | 1/1995 | Sawyer ..................................... | 330/260 |
| 5,379,457 | 1/1995 | Nguyen ..................................... | 455/323 |
| 5,465,072 | 11/1995 | Atarodi ..................................... | 330/254 |
| 5,563,545 | 10/1996 | Scheinberg .............................. | 327/389 |
| 5,847,623 | 12/1998 | Hadjichristos .......................... | 327/359 |

FOREIGN PATENT DOCUMENTS

| | | |
|---|---|---|
| 44 10 030 A1 | 1/1995 | Germany . |
| 5-114823 | 5/1993 | Japan . |

OTHER PUBLICATIONS

"RF Analog and Digital Circuits in SiGe Technology," J. Long, et al, *1996 IEEE International Solid–State Circuits Conference*, pp. 82–83.

*Primary Examiner*—Kenneth B. Wells
*Attorney, Agent, or Firm*—McDermott, Will & Emery

[57] ABSTRACT

A phase shifter is provided between common emitters of two differential transistor pairs of a mixer circuit. The phase shifter changes the phase of a voltage signal input to one common emitter by 180° and applies it to the other common emitter, and causes a current in accordance with the voltage between the common emitters. As compared with the prior art employing two stages of vertically connected differential transistor pairs, the power supply voltage can be reduced.

7 Claims, 4 Drawing Sheets

MIXER CIRCUIT FOR MIXING TWO SIGNALS HAVING MUTUALLY DIFFERENT FREQUENCIES

CROSS-REFERENCE TO RELATED APPLICATION

This application is related to co-pending application Ser. No. 08/788,837, filed Jan. 27, 1997.

BACKGROUND OF THE INVENTION

1. Field of the Invention

The present invention relates to a mixer circuit and, more specifically, to a mixer circuit for mixing first and second signals having mutually different frequencies to output a third signal.

2. Description of the Background Art

Conventionally, a mixer circuit for mixing two signals $v_1$ and $v_2$ having mutually different frequencies has been used in the field of communication. The mixer circuit forms a part of a multiplier circuit, a modulator, a phase detector and the like.

FIG. 7 is a schematic block diagram showing a structure of a conventional Gilbert type mixer circuit. Referring to FIG. 7, the mixer circuit includes a constant current source 50, NPN bipolar transistors 51 to 56, first input terminal pair 61a, 61b, second input terminal pair 62a, 62b and output terminal pair 63a, 63b.

The first pair of input terminals 61a and 61b receive mutually complementary signals $V_{1+}$ and $V_{1-}$ (where $v_1 = v_{1+} - v_{1-}$). The second pair of input terminals 62a and 62b receive mutually complementary signals $v_{2+}$ and $v_{2-}$ (where $v_2 = v_{2+} - v_{2-}$). Transistors 51 and 52, 53 and 54, and 55 and 56 form differential transistor pairs, respectively.

More specifically, transistors 51 and 52 have their bases connected to input terminals 61a and 61b, and emitters connected commonly to each other and to a line of a ground potential GND through constant current source 50. Constant current source 50 causes flow of a constant current $2I_{EE}$.

Transistors 53 and 54 have their bases connected to input terminals 61a and 61b, respectively, and emitters commonly connected to each other and to the collector of transistor 51.

Transistors 55 and 56 have their gates connected to input terminals 61b and 61a, respectively, and emitters connected commonly to each other and to the collector of transistor 52.

Transistors 53 and 55 have their connectors connected commonly to each other and to output terminal 63a, and transistors 54 and 56 have their collectors connected commonly to each other and to output terminal 63b.

The operation of mixer circuit shown in FIG. 7 will be described. Signals $v_{1+}$ and $v_{1-}$ are converted to collector currents of transistors 51 and 52 and amplified, by the differential transistor pair consisting of transistors 51 and 52. The collector current of transistor 51 serves as the emitter current (base current) of the differential transistor pair consisting of transistors 53 and 54. The collector current of transistor 52 serves as the emitter current of differential transistor pair consisting of transistors 55 and 56.

Signals $v_{2+}$ and $v_{2-}$ are converted to collector currents of transistors 53 and 54 and amplified by differential transistor pair consisting of transistors 53 and 54, and converted to collector currents of transistors 56 and 55 and amplified by the differential transistor pair consisting of transistors 55 and 56. The sum of collector currents of transistors 53 and 56 is provided as an output current $i_{out+}$, and sum of collector currents of transistors 54 and 55 is provided as an output current $i_{out-}$. Therefore, output currents $i_{out+}$ and $i_{out-}$ have mutually complementary waveforms mixing signals $v_1$ and $v_2$.

This relation is represented by the following equations. When thermal voltage is represented by $V_T$, collector currents $i_{c51}$ to $i_{c56}$ of transistors 51 to 56 are represented by the following equations (1) to (6), respectively.

$$i_{C51} = \frac{2I_{EE}}{1 + \exp\left(-\frac{v_1}{V_T}\right)} \tag{1}$$

$$i_{C52} = \frac{2I_{EE}}{1 + \exp\left(\frac{v_1}{V_T}\right)} \tag{2}$$

$$i_{C53} = \frac{i_{C51}}{1 + \exp\left(-\frac{v_2}{V_T}\right)} \tag{3}$$

$$i_{C54} = \frac{i_{C51}}{1 + \exp\left(\frac{v_2}{V_T}\right)} \tag{4}$$

$$i_{C55} = \frac{i_{C52}}{1 + \exp\left(-\frac{v_2}{V_T}\right)} \tag{5}$$

$$i_{C56} = \frac{i_{C52}}{1 + \exp\left(-\frac{v_2}{V_T}\right)} \tag{6}$$

From equations (1) to (6), the relations between collector currents $i_{c53}$ to $i_{c56}$ and input signals $v_1$ and $v_2$ can be represented by the following equations (7) to (10).

$$i_{C53} = \frac{2I_{EE}}{\left[1 + \exp\left(-\frac{v_1}{V_T}\right)\right]\left[1 + \exp\left(-\frac{v_2}{V_T}\right)\right]} \tag{7}$$

$$i_{C54} = \frac{2I_{EE}}{\left[1 + \exp\left(-\frac{v_1}{V_T}\right)\right]\left[1 + \exp\left(\frac{v_2}{V_T}\right)\right]} \tag{8}$$

$$i_{C55} = \frac{2I_{EE}}{\left[1 + \exp\left(\frac{v_1}{V_T}\right)\right]\left[1 + \exp\left(\frac{v_2}{V_T}\right)\right]} \tag{9}$$

$$i_{C56} = \frac{2I_{EE}}{\left[1 + \exp\left(\frac{v_1}{V_T}\right)\right]\left[1 + \exp\left(-\frac{v_2}{V_T}\right)\right]} \tag{10}$$

Here, it holds that $i_{out+} = i_{c53} + i_{c55}$, $i_{out-} = i_{c54} + i_{c56}$. The difference $i_{out+} - i_{out-}$ between the output currents $i_{out+}$ and $i_{out-}$ is represented by the following equation (11).

$$i_{OUT+} - i_{OUT-} = 2I_{EE}\left[\tanh\left(\frac{v_1}{2V_T}\right)\right]\left[\tanh\left(\frac{v_2}{2V_T}\right)\right] \tag{11}$$

Here, series expansion of tanhx results in $\tanh x = x - x^3/3$, and therefore it holds that $\tanh x \approx x$ where x is sufficiently smaller than 1. Therefore, the relation between input signals $v_1$ and $v_2$ and output currents $i_{out+}$ and $i_{out-}$ can be represented as $i_{out+} - i_{out-} \approx 2I_{EE}(v_1/2V_T)(v_2/2v_T)$.

In other words, by calculating the difference between output currents $i_{out+}$ and $i_{out-}$ and multiplying the difference by a constant, input signals $v_1$ and $v_2$ can be multiplied.

When input signals $v_1$ and $v_2$ are sinusoidal waves of mutually different frequencies $f_1$ and $f_2$, then the product $v_1v_2$ of the two signals is given by $A\sin(f_1+f_2)t+B\sin(f_1-f_2)t$ (where A and B are constants). Therefore, by separating the component $A\sin(f_1+f_2)t$ from the component $B\sin(f_1-f_2)t$ by means of a filter, it is possible to obtain a signal having the frequency $(f_1+f_2)$ which is the sum of the frequencies of two signals $v_1$ and $v_2$, or a signal having the frequency $(f_1-f_2)$ which is the difference between the frequencies of the two signals $v_1$ and $v_2$.

However, in the conventional mixer circuit, it has been difficult to reduce the power supply voltage, as it employs vertically connected two stages of differential transistor pairs.

SUMMARY OF THE INVENTION

Therefore, an object of the present invention is to provide a mixer circuit which allows decrease of power supply voltage.

Briefly stated, in the present invention, to each of the first and second differential transistor pairs, a first signal and its complementary signal are input, and a second signal is input to a first node which is a common second electrode of the first differential transistor pair. A phase conversion circuit changes the phase of the input second signal only by a predetermined angle and applies it to a second node which is a common second electrode of the second differential transistor pair, and causes a current corresponding to the voltage between the first and second nodes to flow between the first and second nodes. Therefore, only one stage of differential transistor pairs is required, and therefore power supply voltage can be reduced as compared with the prior art employing two stages of vertically connected differential transistor pairs.

Preferably, said predetermined angle is set to 180°. Theoretically, maximum conversion gain is obtained in this case.

Preferably, the predetermined angle is set such that conversion gain of the mixer circuit is maximized. In this case, the conversion gain actually becomes maximum.

Preferably, the phase conversion circuit is formed by a filter. In this case, the phase conversion circuit can be formed by a passive element, and therefore, input/output characteristic with small distortion can be obtained as compared with the prior art in which the second signal is amplified by an active element.

More preferably, the filter is a low pass filter. This facilitates phase conversion.

Preferably, the low pass filter is formed by an inductor connected between the first and second nodes. Therefore, the low pass filter can be easily provided.

Preferably, the low pass filter further includes a capacitor connected between the second node and a line of a reference potential. This further facilitates phase conversion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
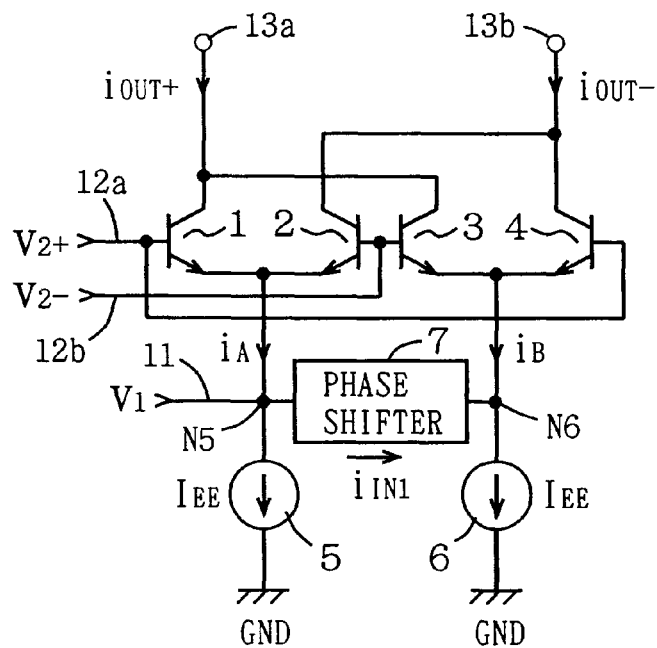
FIG. 1 is a schematic block diagram showing a structure of the mixer circuit in accordance with a first embodiment of the present invention.

FIG. 1 is a schematic block diagram showing the structure of the mixer circuit in accordance with the first embodiment of the present invention. Referring to FIG. 1, the mixer circuit includes NPN bipolar transistors 1 to 4, constant current sources 5 and 6, a phase shifter 7, a first input terminal 11, a second input terminal 12a, a third input terminal 12b and a pair of output terminals 13a and 13b.

To the first input terminal 11, a voltage signal $v_1$ is input. To the second and third input terminals 12a and 12b, mutually complementary voltage signals $v_{2+}$ and $v_{2-}$ (where $v_2=v_{2+}-v_{2-}$) are input. Transistors 1 and 2 and transistors 3 and 4 form differential transistor pairs, respectively.

More specifically, transistors 1 and 2 have their bases connected to input terminals 12a and 12b, and the emitters connected commonly to each other and to the line of ground potential GND through a node N5 and through constant current source 5. Constant current source 5 causes flow of a constant current $I_{EE}$. The first input terminal 11 is connected to node N5.

Transistors 3 and 4 have their bases connected to input terminals 12b and 12a, respectively, and the emitters connected commonly to each other and to the line of the ground potential GND through a node N6 and constant current source 6. Constant current source 6 causes flow of a constant current $I_{EE}$.

Phase shifter 7 is connected between nodes N5 and N6, and changes phase of the signal $v_1$ input to node N5 by 180°, that is, inverts the signal $v_1$, and outputs it to node N6.

Transistors 1 and 3 have their collectors commonly connected to each other and to output terminal 13a, and transistors 2 and 4 have their collectors commonly connected to each other and to output terminal 13b.

The operation of the mixer circuit shown in FIG. 1 will be described. When the signal $v_1$ is input through input terminal 11 to node N5, an inverted signal of $v_1$ is output at node N6. Consequently, there is generated a potential difference between nodes N5 and N6, and current $i_{IN1}$ flows from node N5 to node N6 through phase shifter 7. The current $i_A$ flowing from emitters of transistors 1 and 2 to node N5 will be $i_A=I_{EE}+i_{IN1}$, and the current $i_B$ flowing from emitters of transistors 3 and 4 to node N6 will be $i_B=I_{EE}-i_{IN1}$.

The signals $v_{2+}$ and $v_{2-}$ are converted to collector currents of transistors 1 and 2 and amplified by the differential transistor pair consisting of transistors 1 and 2, and converted to collector currents of transistors 4 and 3 and amplified by the differential transistor pair consisting of transistors 3 and 4. The sum of collector currents of transistors 1 and 3 will be the output current $i_{OUT+}$, and sum of collector currents of transistors 2 and 4 will be output current $i_{out-}$. Therefore, output currents $i_{out+}$ and $i_{out-}$ have mutually complementary waveforms mixing signals $v_1$ and $v_2$.

This relation can be represented by the following equations. More specifically, collector currents $i_{c1}$ to $i_{c4}$ of transistors 1 to 4 are represented by the following equations (12) to (15).

$$i_{C1} = \frac{I_{EE} + i_{IN1}}{1 + \exp\left(-\frac{v_2}{V_T}\right)} \quad (12)$$

$$i_{C2} = \frac{I_{EE} + i_{IN1}}{1 + \exp\left(\frac{v_2}{V_T}\right)} \quad (13)$$

$$i_{C3} = \frac{I_{EE} - i_{IN1}}{1 + \exp\left(\frac{v_2}{V_T}\right)} \quad (14)$$

$$i_{C4} = \frac{I_{EE} + i_{IN1}}{1 + \exp\left(-\frac{v_2}{V_T}\right)} \quad (15)$$

Here, it holds that $i_{out+}=i_{c1}+i_{c3}$, and $i_{out-}=i_{c2}+i_{c4}$. The difference $i_{out+}-i_{out-}$ between the output currents $i_{out+}$ and $i_{out-}$ is given by the following equation (16).

$$\begin{aligned} i_{OUT+} - i_{OUT-} &= i_{C1} + i_{C3} - (i_{C2} + i_{C4}) \quad (16) \\ &= \frac{2i_{IN1}}{1+\exp\left(-\frac{v_2}{V_T}\right)} - \frac{2i_{IN1}}{1+\exp\left(\frac{v_2}{V_T}\right)} \\ &= \frac{\exp\left(\frac{v_2}{V_T}\right) - \exp\left(-\frac{v_2}{V_T}\right)}{\left[1+\exp\left(\frac{v_2}{V_T}\right)\right]\left[1+\exp\left(-\frac{v_2}{V_T}\right)\right]} \times 2i_{IN1} \\ &= 2i_{IN1}\tanh\left(\frac{v_2}{2V_T}\right) \end{aligned}$$

As already mentioned, it holds that $\tanh x \approx x$, and therefore it holds that $i_{out+}-i_{out-}=2i_{IN1}(v_2/2V_T)$ More specifically, by calculating the difference between output currents $i_{out+}$ and $i_{out-}$ and multiplying the difference by a constant, the current $i_{IN1}$ and signal $v_2$ can be multiplied. Since the frequency $f_1$ of current $i_{IN1}$ is equal to the frequency $f_1$ of the signal $v_1$, $i_{IN1}v_2$ can be given by $A\sin(f_1+f_2)t+B\sin(f_1-f_2)$. Therefore, by separating the component $A\sin(f_1+f_2)t$ from the component $B\sin(f_1-f_2)t$ by means of a filter, a signal having the frequency $(f_1+f_2)$ which is the sum of frequencies of two signals $v_1$ and $v_2$, or a signal having the frequency $(f_1-f_2)$ which is the difference between frequencies of two signals $v_1$ and $v_2$ can be obtained.

In the present embodiment, only one stage of differential transistor pairs is required, and therefore compared with the conventional mixer circuit employing two stages of vertically connected differential transistor pairs, the power supply voltage can be reduced.

Further, phase shifter 7 can be formed by a passive element, and therefore, compared with the prior art employing active elements (transistors 51, 52) for amplifying signals $v_1$ and $v_2$, characteristic with small distortion can be obtained.

Second Embodiment

Figure 2:
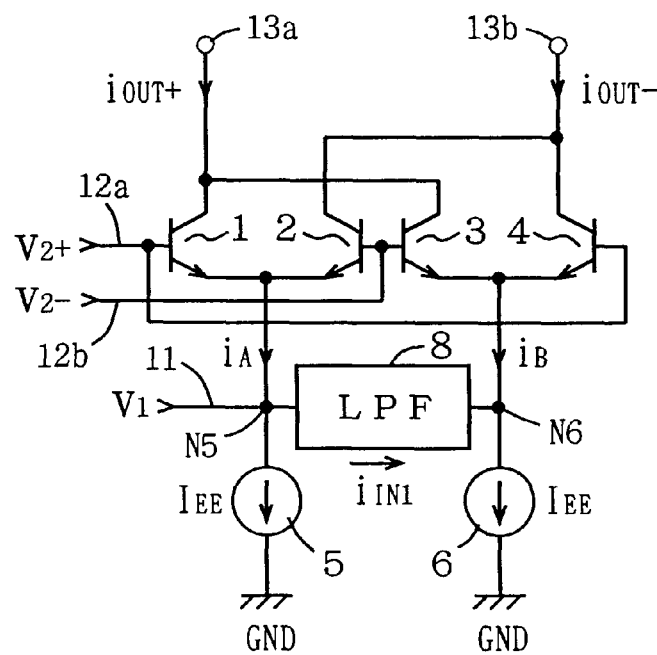
FIG. 2 is a schematic block diagram showing a structure of the mixer circuit in accordance with a second embodiment of the present invention.

FIG. 2 is a schematic block diagram showing a structure of the mixer circuit in accordance with the second embodiment of the present invention. Referring to FIG. 2, the mixer circuit is different from the mixer circuit shown in FIG. 1 in that the phase shifter 7 is replaced by a low pass filter (LPF) 8. Low pass filter 8 serves as the phase shifter 7.

Figure 3:
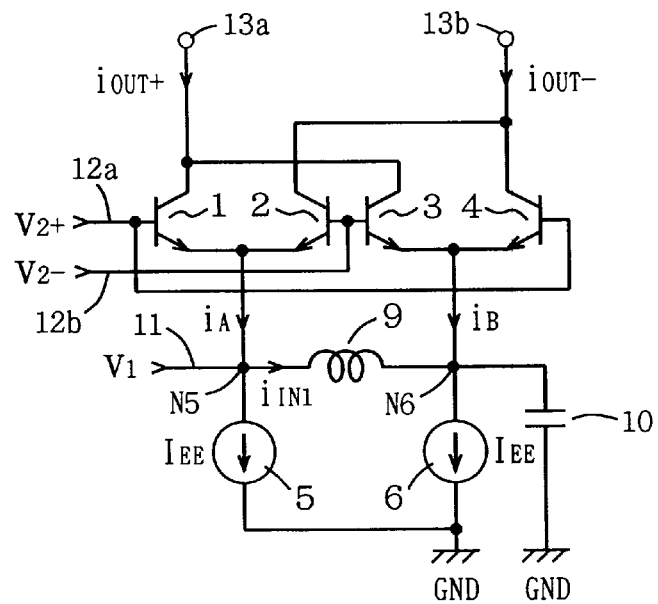
FIG. 3 is a schematic block diagram showing a detailed structure of the mixer circuit shown in FIG. 2.

Low pass filter 8 includes, as shown in FIG. 3, an inductor 9 connected between nodes N5 and N6, and a capacitor 10 connected between node N5 and the line of the ground potential GND. When inductance LE of inductor 9 and capacitance CE of capacitor 10 satisfy the relation of expression (17) below, an inverted signal having the phase changed by 180° from the input signal $v_1$ can be obtained at node N6.

$$f_1 > \frac{1}{2\pi\sqrt{LE \cdot CE}} \quad (17)$$

The same effect as in the first embodiment can be obtained in accordance with the second embodiment.

However, actually, because of the loss caused by parasitic components of inductor 9 and capacitor 10 and by the filtering characteristic of low pass filter 8, the phase difference between the signals at nodes N5 and N6 necessary for maximizing conversion gain is off from 180°.

Figure 4A:
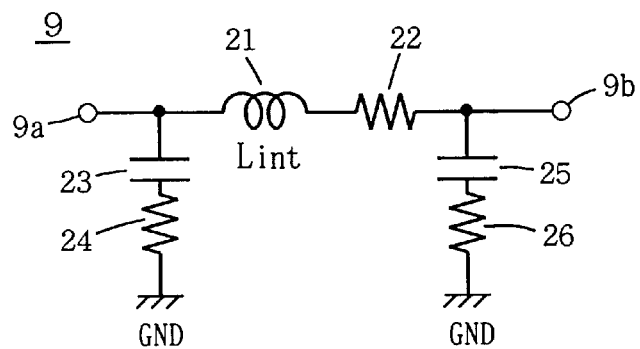
FIGS. 4A and 4B are schematic diagrams showing circuits taking into account parasitic component of a capacitor and an inductor shown in FIG. 3.

More specifically, when the parasitic component is taken into account, inductor 9 can be represented as including an inductor 21 and a resistance element 22 connected in series between one terminal 9a and the other terminal 9b, a capacitor 23 and a resistance element 24 connected in series between one terminal 9a and a line of the ground potential GND, and a capacitor 25 and a resistance element 26 connected in series between the other end 9b and the line of the ground potential GND, as shown in FIG. 4A.

Figure 4B:
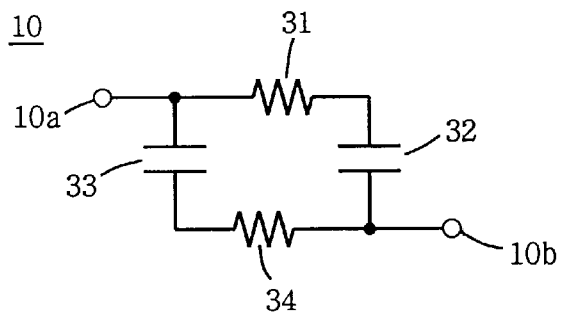

Similarly, when the parasitic component is taken into account, capacitor 9 is represented as including a resistance element 31 and a capacitor 32 connected in series between one terminal 10a and the other terminal 10b, and a capacitor 33 and a resistance element 34 connected in series between one terminal 10a and the other terminal 10b, as shown in FIG. 4b.

Figure 5:
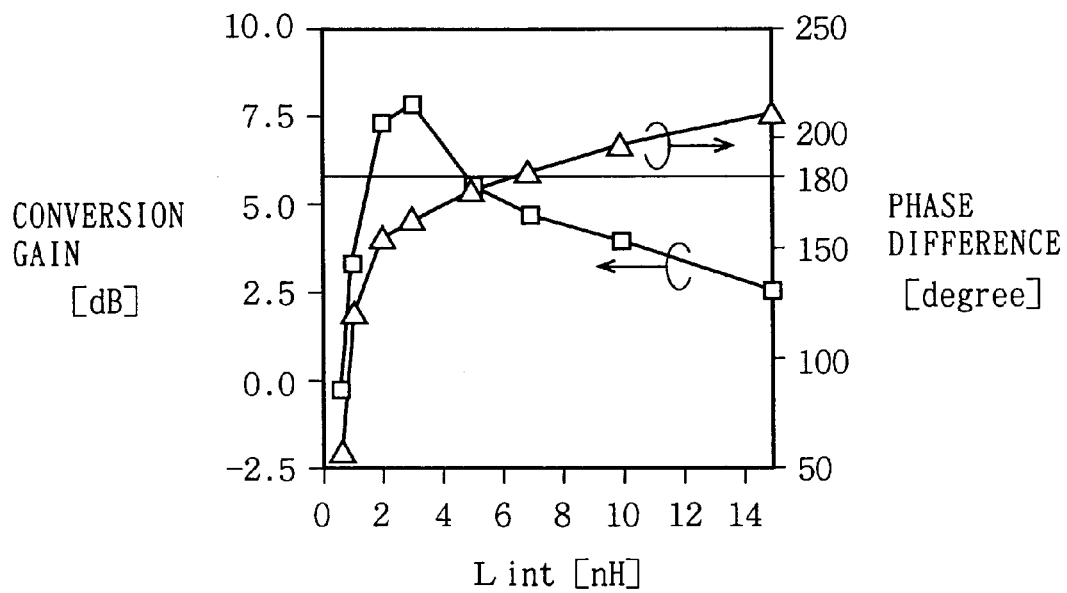
FIG. 5 shows result of simulation of changes in conversion gain and phase difference with respect to change in inductance of the mixer circuit shown in FIGS. 2 to 4A and 4B.

FIG. 5 shows result of simulation when inductor 9 and capacitor 10 of FIG. 3 are replaced by the circuit of FIGS. 4A and 4B. In FIG. 5, the abscissa represents inductance Lint of inductor 21, one ordinate represents conversion gain, and the other ordinate represents phase difference of the signal at node N6 with respect to the signal $v_1$ at node N5. Here, capacitance CE is set to 7.2 pF, and magnitude of parasitic component of inductor 9 is changed in accordance with the magnitude of inductance Lint. As can be seen from FIG. 5, conversion gain is not maximized when the phase difference is 180°, that is, when inductance Lint is about 6.5 nH, but maximized when inductance Lint is about 3.5 nH. Therefore, preferably, the inductance Lint is set to about 3.5 nH so as to maximize conversion gain.

Figure 6:
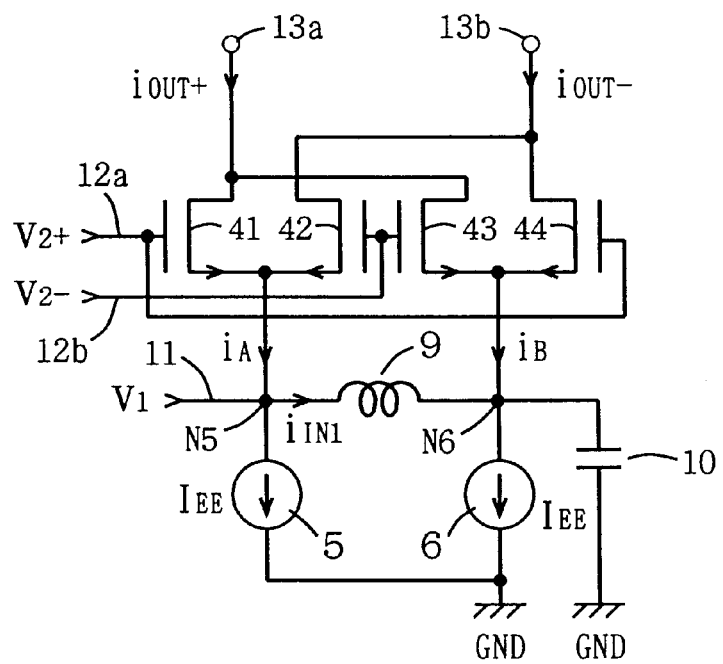
FIG. 6 is a schematic block diagram showing an improvement of the mixer circuit shown in FIGS. 2 to 5.
Figure 7:
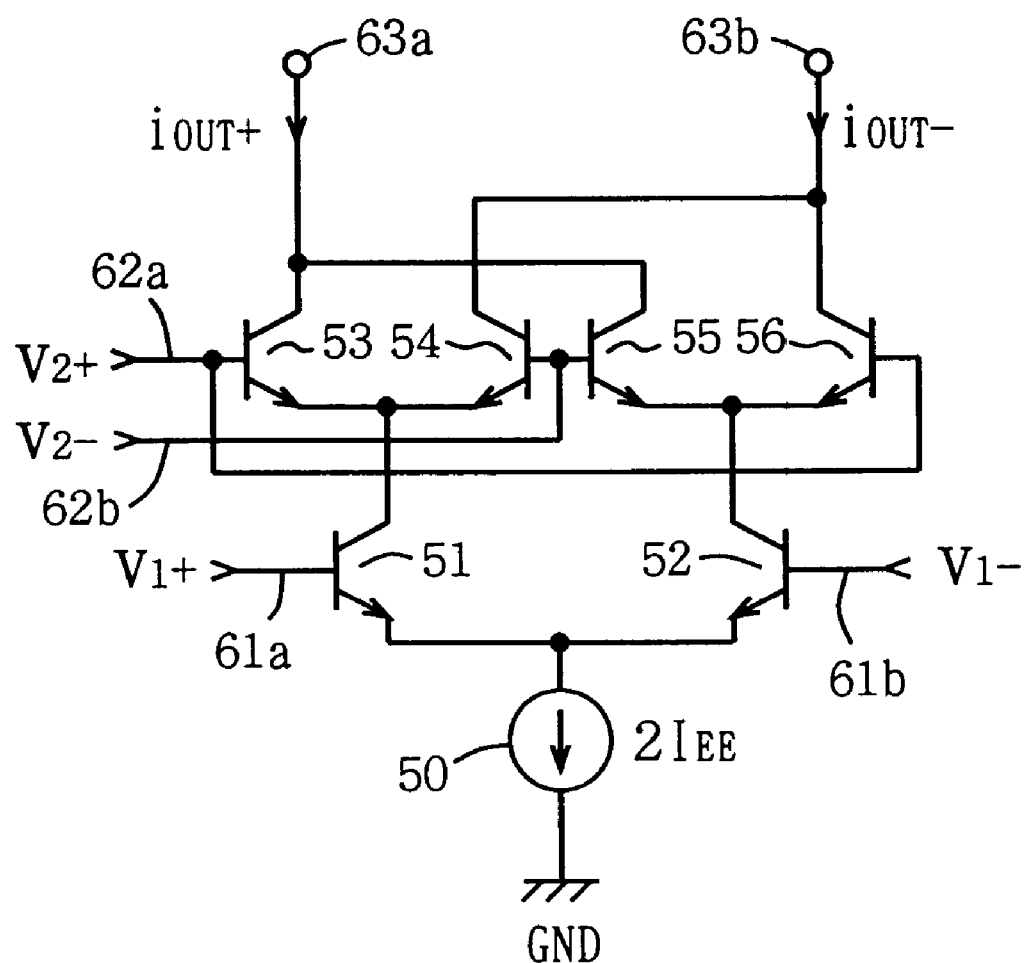
FIG. 7 is a schematic block diagram showing a structure of a conventional mixer circuit.

In this embodiment, differential transistor pairs are formed by NPN bipolar transistors 1 to 4. However, the differential transistor pairs may be formed by N channel MOS transistors 41 to 44, as shown in FIG. 6. It is advantageous for higher degree of integration to use N channel MOS transistors 41 to 44 than NPN bipolar transistors 1 to 4. Further, the differential transistor pairs may be formed by P channel MOS transistors, or any other transistors such as GaAs transistors or MES transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A mixer circuit for mixing first and second signals having mutually different frequencies, for outputting a third signal, comprising:

first and second output terminals from which said third signal and its complementary signal are output respectively;

a first pair of differential transistors receiving at respective input electrodes said first signal and its complementary signal, having respective first electrodes connected to said first and second output terminals and respective second electrodes connected together to a first node to receive said second signal;

a second pair of differential transistors receiving at respective input electrodes said first signal and its complementary signal, having respective first electrodes connected to said second and first output terminals, and respective second electrodes connected together to a second node;

first and second constant current sources respectively causing a constant current at said first and second nodes, respectively; and phase conversion means connected between said first and second nodes, for changing the phase of said second signal input to said first node by a predetermined angle and applying it to said second node, and causing a current in accordance with a voltage between said first and second nodes between said first and second nodes.

2. The mixer circuit according to claim 1, wherein said predetermined angle is 180°.

3. The mixer circuit according to claim 1, wherein said predetermined angle is set to maximize the conversion gain of said mixer circuit.

4. The mixer circuit according to claim 1, wherein said phase conversion means is a filter.

5. The mixer circuit according to claim 4, wherein said filter is a low pass filter.

6. The mixer circuit according to claim 5, wherein said low pass filter includes an inductor connected between said first and second nodes.

7. The mixer circuit according to claim 6, wherein said low pass filter further includes a capacitor connected between said second node and a line of a reference potential.

* * * * *

UNITED STATES PATENT AND TRADEMARK OFFICE
CERTIFICATE OF CORRECTION

PATENT NO. : 5,973,539
DATED : October 26, 1999
INVENTOR(S) : Hiroshi KOMURASAKI, et al.

It is certified that error appears in the above-identified patent and that said Letters Patent is hereby corrected as shown below:

Column 2, lines 24 and 25, equation enumerated as (5):

change $$i_{CSS} = \frac{i_C 52}{1+\exp\left(-\frac{v_2}{V_T}\right)} \quad (5)$$

to $$i_{CSS} = \frac{i_C 52}{1+\exp\left(\frac{v_2}{V_T}\right)} \quad (5)$$

UNITED STATES PATENT AND TRADEMARK OFFICE
CERTIFICATE OF CORRECTION

PATENT NO. : 5,973,539
DATED : October 26, 1999
INVENTOR(S) : Hiroshi KOMURASAKI, et al.

It is certified that error appears in the above-identified patent and that said Letters Patent is hereby corrected as shown below:

Column 5, lines 16 and 17, equation enumerated as (15):

change $$i_{C4} = \frac{I_{EE} + i_{el}}{1 + \exp\left(-\frac{V_2}{V_T}\right)} \quad (15)$$

to $$i_{C4} = \frac{I_{EE} - i_{el}}{1 + \exp\left(-\frac{V_2}{V_T}\right)} \quad (15)$$

UNITED STATES PATENT AND TRADEMARK OFFICE
CERTIFICATE OF CORRECTION

PATENT NO. : 5,973,539
DATED : October 26, 1999
INVENTOR(S) : Hiroshi KOMURASAKI, et al.

It is certified that error appears in the above-identified patent and that said Letters Patent is hereby corrected as shown below:

Column 5, lines 27 and 28, equation enumerated as (16):

change $$= \frac{2i_{\epsilon l}}{1+\exp\left(-\frac{V_2}{V_T}\right)} - \frac{2i_{\epsilon l}}{1+\exp\left(-\frac{V_2}{V_T}\right)} \tag{16}$$

to $$= \frac{2i_{\epsilon l}}{1+\exp\left(-\frac{V_2}{V_T}\right)} - \frac{2i_{\epsilon l}}{1+\exp\left(\frac{V_2}{V_T}\right)} \tag{16}$$

Signed and Sealed this

Twenty-sixth Day of September, 2000

Q. TODD DICKINSON

Attest:

Attesting Officer

Director of Patents and Trademarks

UNITED STATES PATENT AND TRADEMARK OFFICE
CERTIFICATE OF CORRECTION

PATENT NO. : 5,973,539
DATED : October 26, 1999
INVENTOR(S) : Hiroshi Komurasaki, et. al.

It is certified that error appears in the above-identified patent and that said Letters Patent is hereby corrected as shown below:

Column 2, lines 24 and 25, equation enumerated as (5):

change $$i_{CSS} = \frac{i_c 52}{1+\exp\left(\frac{v_2}{V_T}\right)} \quad (5)$$

to $$i_{CSS} = \frac{i_{c52}}{1+\exp\left(\frac{v_2}{V_T}\right)} \quad (5)$$

Column 5, lines 16 and 17, equation enumerated as (15):

change $$i_{C4} = \frac{I_{EE} - i_{c1}}{1+\exp\left(-\frac{V_2}{V_T}\right)} \quad (15)$$

to $$i_{C4} = \frac{I_{EE} - i_{IN1}}{1+\exp\left(-\frac{V_2}{V_T}\right)} \quad (15)$$

UNITED STATES PATENT AND TRADEMARK OFFICE
CERTIFICATE OF CORRECTION

PATENT NO. : 5,973,539
DATED : October 26, 1999
INVENTOR(S) : Hiroshi Komurasaki, et. al.

It is certified that error appears in the above-identified patent and that said Letters Patent is hereby corrected as shown below:

Column 5, lines 27 and 28, equation enumerated as (16):

change $$= \frac{2i_{c1}}{1+\exp\left(-\frac{V_2}{V_T}\right)} - \frac{2i_{c1}}{1+\exp\left(-\frac{V_2}{V_T}\right)} \quad (16)$$

to $$= \frac{2i_{IN1}}{1+\exp\left(-\frac{V_2}{V_T}\right)} - \frac{2i_{IN1}}{1+\exp\left(\frac{V_2}{V_T}\right)} \quad (16)$$

Signed and Sealed this

Twenty-seventh Day of February, 2001

Attest:

NICHOLAS P. GODICI

Attesting Officer    Acting Director of the United States Patent and Trademark Office